(12) United States Patent
Chitturi et al.

(10) Patent No.: US 8,427,216 B1
(45) Date of Patent: Apr. 23, 2013

(54) SER TOLERANT FLIP FLOP HAVING A REDUNDANT LATCH

(75) Inventors: Vinay Chitturi, Sunnyvale, CA (US); Oscar M. Siguenza, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/230,192

(22) Filed: Sep. 12, 2011

Related U.S. Application Data

(60) Provisional application No. 61/381,830, filed on Sep. 10, 2010.

(51) Int. Cl.
*H03K 3/289* (2006.01)

(52) U.S. Cl.
USPC .......................................................... 327/202

(58) Field of Classification Search ................ None
See application file for complete search history.

(56) References Cited

U.S. PATENT DOCUMENTS

2008/0238510 A1* 10/2008 Aksamit ........................ 327/198
2010/0213998 A1* 8/2010 Uemura et al. ............... 327/203

\* cited by examiner

*Primary Examiner* — Lincoln Donovan
*Assistant Examiner* — Sibin Chen

(57) ABSTRACT

A circuit configured to resist a radiation strike includes a latch having an input node and an output node, and a first resistive element configured to be coupled to the first input node to resist a change of a state data at the input node from a radiation strike. The circuit further includes an input stage coupled to the input node and configured to be clocked to transfer the state data to the latch. The circuit further includes a pass circuit configured to be clocked after the input stage to couple the first resistive element to the input node after the input stage transfers the state data to the latch.

23 Claims, 6 Drawing Sheets

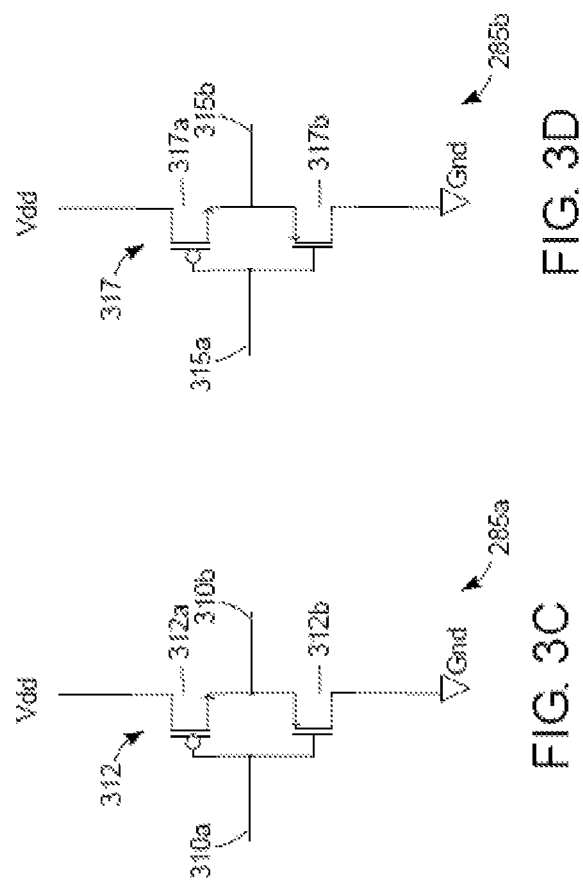

SER TOLERANT FLIP FLOP HAVING A REDUNDANT LATCH

CROSS REFERENCE TO RELATED APPLICATIONS

This application claims the benefit of, and priority to, U.S. Provisional Patent App. No. 61/381,830, filed Sep. 10, 2010, titled "SER TOLERANT FLIP FLOP USING A REDUNDANT LATCH," of Chitturi, which is incorporated herein by reference in its entirety for all purposes.

BACKGROUND

Embodiments of the present invention generally relate to flip flops, and more particularly relate to a flip flop having a protection circuit for protecting data stored by the flip flop from radiation impacts.

Unless otherwise indicated herein, the circuits and circuit methods described in the background section are not prior art to the claims in this application and are not admitted to be prior art by inclusion in the background section.

Storage circuits, such as flip flops, latches, and memories, store data in the form of charge. Relatively high energy radiation ("radiation"), such as high energy photons, electrons, protons, neutrons, etc. can disrupt the data stored in storage circuits by disrupting the charge that represents the data. The radiation can free electrons and generate holes in the material (e.g., semiconductor material) storing the charge. The free electrons and holes can change the charge representing the data and therefore can change the state of the data.

Radiation having sufficient energy to change the data in a storage circuit is prevalent in many environments, such as space, high-altitude flight, near nuclear reactors, particle accelerators, and the like. Radiation of such energy also reaches the surface of the Earth, however, with generally less intensity but does cause storage circuits to fail. Radioactive isotopes in circuit-packaging materials have historically been a source of radiation for storage circuits although the potential of radiation from radioactive isotopes in circuit packaging has been reduced in recent years from the use higher purity materials used for circuit packaging.

Storage circuits configured for use in environments where radiation of sufficient energy exists are often "hardened" to the effects of such radiation. Hardening generally referrers to a variety of circuit designs, circuit methods, circuit packaging, and the like configured to mitigate the effects of such radiation. Further, circuits for which low failure rates are desired also hardened. For example, in banking applications were circuits operate substantially continuously for long periods of time may have a high probability of eventually being struck by radiation and possibly having a data failure due to the radiation.

The semiconductor industry continues to strive to design and manufacture new storage circuits and the like, which can withstand the negative effects of radiation on charge that represents data in a storage circuit.

SUMMARY

Embodiments of the present invention generally relate to flip flops, and more particularly relate to a flip flop having a protection circuit for protecting data stored by the flip flop from radiation impacts.

According to one embodiment of the present invention, a circuit configured to resist a radiation strike includes a latch having an input node and an output node. The circuit further includes a first resistive element configured to be coupled to the first input node to resist a change of a state data at the input node from a radiation strike. The circuit further includes an input stage coupled to the input node and configured to be clocked to transfer the state data to the latch. The circuit further includes a pass circuit configured to be clocked after the input stage to couple the first resistive element to the input node after the input stage transfers the state data to the latch.

According to one specific embodiment, the circuit further includes a first capacitive element configured to be coupled to the input node to resist a change of the state data at the input node from a radiation strike. If the pass circuit is clocked, the pass circuit is configured to couple the first capacitive element to the input node. The first capacitive element includes a pair of transistors having coupled gates, first source-drain regions coupled to a voltage source, and second source-drain regions coupled to a ground. The coupled gates are couple to the pass circuit to provide capacitance to the input node to collect charges generated by a radiation strike at the input node.

According to another specific embodiment, the latch and the first resistive element are disposed diagonally in a circuit layout of the circuit, and the latch and the first capacitive element are disposed diagonally in the circuit layout.

According to another specific embodiment, the circuit layout is for a tri-level circuit. The latch is on a first circuit level of the tri-level circuit, and the first resistive element and the first capacitive elements are on a third circuit level of the tri-level circuit. The first circuit level includes a first n-well and the third circuit level includes a second n-well, which is different from the first n-well.

According to another specific embodiment, the circuit further includes a second resistive element configured to be coupled to the output node to resist a change of a second state data at the output node from a radiation strike. The circuit further includes a second pass circuit configured to be clocked after the input stage to couple the second resistive element to the output node after the input stage transfers the state data to the latch.

The second resistive element includes a first pull-up transistor and a first pull-down transistor in series and gates of the first pull-up transistor and the first pull-down transistor are coupled to the input node and configured to receive the state data at the input node. The first pull-up transistor is configured to pull up the output node if the state data at the input node is low, and the pull-down transistor is configured to pull down the output node if the state data at the input node is high. The first resistive element includes a second pull-up transistor and a second pull-down transistor in series and gates of the second pull-up transistor and the second pull-down transistor are coupled to the second resistive element to receive the state data from the input node via the second resistive element. The second pull-up transistor is configured to pull up the input node if the state data at the input node is high, and the second pull-down transistor is configured to pull down the input node if the state data at the input node is low.

According to another specific embodiment, the circuit further includes a second capacitive element configured to be coupled to the output node to resist a change of the second state data at the output node from a radiation strike. If the second pass circuit is clocked, the pass circuit is configured to couple the second capacitive element to the output node. The second capacitive element includes a pair of transistors having coupled gates, first source-drain regions coupled to a voltage source, and second source-drain regions coupled to a ground. The coupled gates are couple to the second pass circuit to provide capacitance to the output node to collect charges generated by a radiation strike at the output node.

According to another specific embodiment, the input node and the output node are latch nodes of the latch that latch the state data and an inversion of the state date, respectively.

According to another specific embodiment, the circuit further includes a clock network coupled to the input stage and the pass circuit and configured to clock the input stage before the pass circuit. The latch may be a master latch or a slave latch.

According to another embodiment of the present invention, a circuit configured to resist a radiation strike includes a latch having an input node and an output node. The circuit further includes a capacitive element configured to be coupled to the first input node to resist a change of a state data at the input node from a radiation strike. The circuit further includes an input stage coupled to the input node and configured to be clocked to transfer the state data to the latch. The circuit further includes a pass circuit configured to be clocked after the input stage to couple the capacitive element to the input node after the input stage transfers the state data to the latch.

According to a specific embodiment, the circuit further includes a resistive element configured to be coupled to the input node to resist a change of the state data at the input node from a radiation strike. If the pass circuit is clocked, the pass circuit is configured to couple the resistive element to the input node.

According to another specific embodiment, the circuit further includes a second capacitive element configured to be coupled to the output node to resist a change of a second state data at the output node from a radiation strike, and a second pass circuit configured to be clocked after the input stage to couple the second capacitive element to the output node after the input stage transfers the state data to the latch.

According to another specific embodiment, the circuit further includes a second resistive element configured to be coupled to the output node to resist a change of the second state data at the output node from a radiation strike. If the second pass circuit is clocked, the pass circuit is configured to couple the second resistive element to the output node. The input node and the output node are latch nodes of the latch that latch the state data and an inversion of the state date, respectively. The circuit may further include a clock network coupled to the input stage and the pass circuit and may be configured to clock the input stage before the pass circuit.

The following detailed description and accompanying drawings provide a more detailed understanding of the nature and advantages of the present invention.

BRIEF DESCRIPTION OF THE DRAWINGS

FIGS. 3A-3D are further detailed views of the resistive element of the latch circuit according to one embodiment of the present invention;

DETAILED DESCRIPTION

Embodiments of the present invention generally provide a flip flop, and more particularly provide a flip flop having a protection circuit for protecting data stored by the flip flop from radiation impacts.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Storage circuits, such as flip flops, latches, and memories, store data in the form of charge. Relatively high energy radiation ("radiation"), such as high energy photons, electrons, protons, neutrons, alpha particles, etc. can disrupt the data stored in storage circuits by disrupting the charge that represents the data. The radiation can free electrons and generate holes in the material (e.g., semiconductor material) storing the charge. The free electrons and holes can change the charge representing the data and therefore can change the state of the data.

Figure 1:
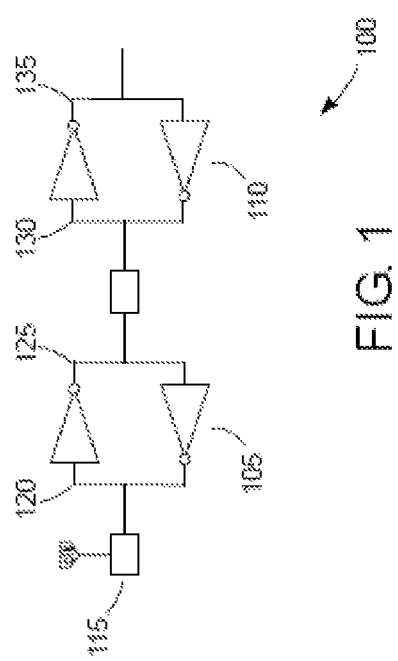
FIG. 1 is a simplified schematic of a latch circuit, which may be susceptible to having stored-data states disrupted from radiation strikes.

FIG. 1 is a simplified schematic of a latch circuit 100, which may be susceptible to having stored-data states disrupted from radiation. Latch circuit 100 includes a master latch 105 and a slave latch 110. Latch circuit 100 also includes an input network 115 configured to provide state data (i.e., input) that are configured to be stored by the latches. Once the state data are stored in the latches, the latches are particularly vulnerable to radiation strikes, which can change the state data. At a first node 120 and a second node 125 of the master latch, the master latch is vulnerable to radiation strikes that can change the state data of the master latch. At a third node 130 and a fourth node 135 of the slave latch, the slave latch is vulnerable to radiation strikes, which can change the state data of the slave latch. Embodiments of the present invention are directed at protecting the state data stored in such nodes.

Figure 2:
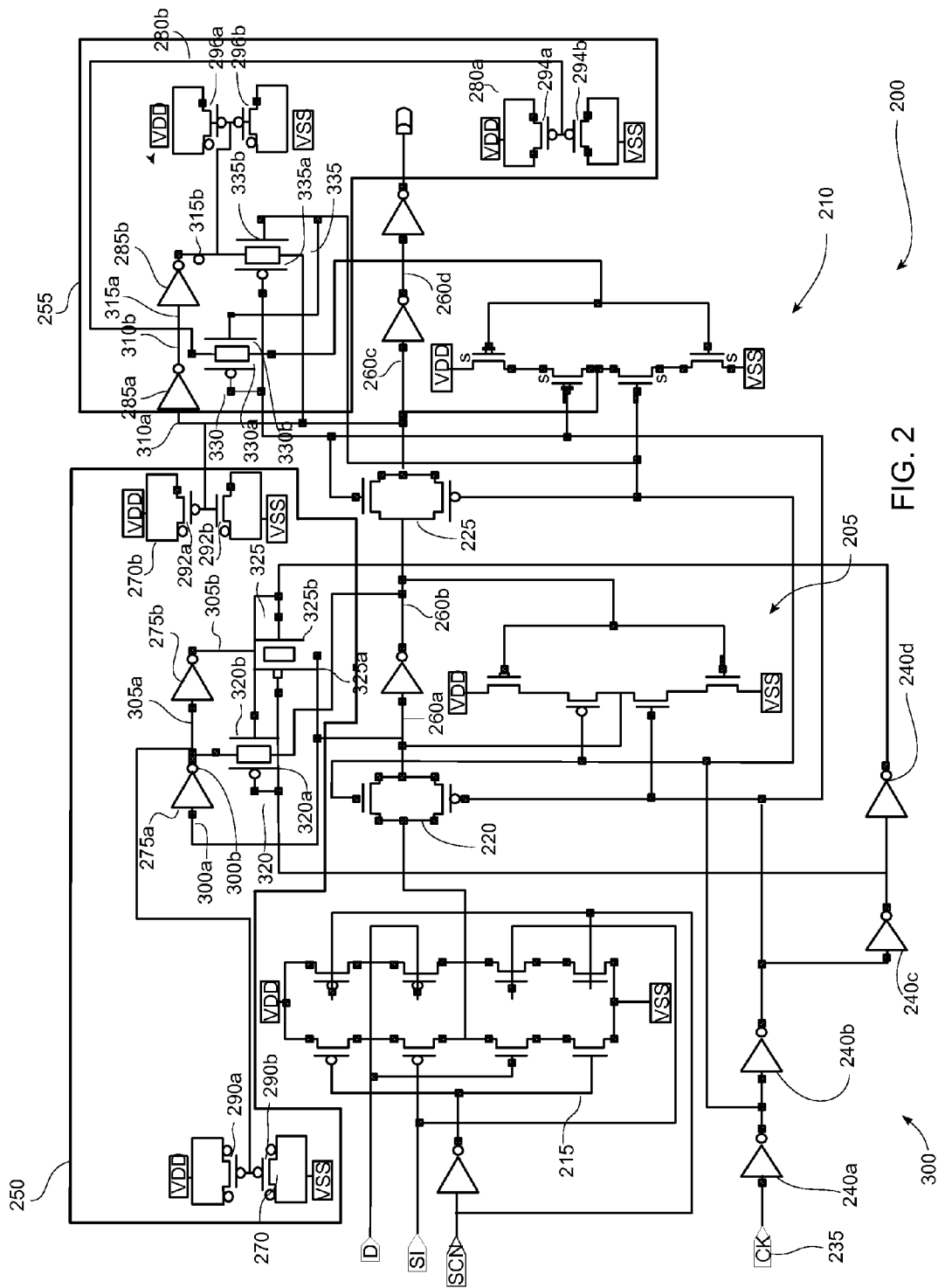
FIG. 2 is simplified circuit schematic a of a latch circuit according to one embodiment of the present invention.

FIG. 2 is a simplified circuit schematic of a latch circuit 200 according to one embodiment of the present invention. Latch circuit 200 includes a master latch 205 and a slave latch 210 configured to store state data. Latch circuit 200 also includes a first input stage 215 and a second input stage 220 configured to provide state data to the master latch, and includes a third input stage 225 configured to provide state data from the master latch to the slave latch. The second input stage 220 and the third input stage 225 are clocked input stages configured to be clocked by a clock network 230 of the latch circuit.

Clock network 230 includes a clock input 235 configured to receive a clock signal. Clock network 230 also includes a set of delay circuits 240, which may be inverting delay circuits. The delay circuits may be op-amps or the like that are configured to delay the received clock signal before transmitting the clock signal forward. Each delay circuit is labeled with the base reference number 240 and an alphabetic suffix. The set of delay circuits is configured to receive a clock pulse from the clock input and each delay circuit is configured to delay the clock pulse before transmitting the clock pulse forward. Specifically, the first delay circuit 240a is configured to receive a clock pulse from the clock input 235 and delay the clock pulse before passing the clock pulse to second delay circuit 240b. Second delay circuit 240b is configured to receive the clock pulse from first delay circuit 240a and delay the clock pulse before passing the clock pulse to third delay circuit 240c. Third delay circuit 240c is configured to receive the clock pulse from second delay circuit 240b and delay the clock pulse before passing the clock pulse to fourth delay circuit 240d. Fourth delay circuit 240d is configured to receive the clock pulse from third delay circuit 240c and delay the clock pulse before passing the clock pulse forward.

Latch circuit 200 also includes a first node-protection circuit 250 and a second node-protection circuit 255. The first node-protection circuit 250 is configured to protect the state data at a first node 260a and/or a second node 260b of the master latch. The second node-protection circuit 255 is configured to protect the state data at a third node 260c and/or a fourth node 260d of the slave latch.

The first node-protection circuit 250 and the second node-protection circuit 255 are configured to provide a capacitive load and/or a resistive load to the first, second, third, and/or fourth nodes of the master latch and the slave latch. The capacitive loads are configured to remove charge or add charge to the first, second, third, and/or fourth node if one or more of these nodes incurs a radiation strike, which causes charges to be generated at the nodes. The resistive loads are configured to pull the nodes up or down depending on the state data at the nodes.

The first node-protection circuit 255 may include a first capacitive element 270a and a second capacitive element 270b, and may include a first resistive element 275a and a second resistive element 275b. The second node-protection circuit may include a third capacitive element 280a and a fourth capacitive element 280b, and may include a third resistive element 285a and a fourth resistive element 285b. The first, second, third, and fourth capacitive elements may include a variety of types of capacitor types, such as polysilicon plate capacitors, metal layer capacitors, p-n junction capacitors, transistor capacitors, etc. According to one specific embodiment, first capacitive element 270a includes a first transistor (e.g., a pMOSFET) 290a and a second transistor (e.g., an nMOSFET) 290b (i.e., complementary MOSFETs). The gates of the first transistor and the second transistor may be coupled where the coupled gates form a capacitor and are each configured to store charge for the capacitive element. The source and drain of the first transistor 290a may be coupled to a voltage source Vdd and the source and drain of the second transistor 290b may be coupled to ground. The second capacitive element 270b may similarly include a first transistor (e.g., a pMOSFET) 292a and a second transistor (e.g., an nMOSFET) 292b where the first and the second transistors 292a and 292b are configured substantially similarly to first and second transistors 290a and 290b as described immediately above. The third capacitive element 270c may similarly include a first transistor (e.g., a pMOSFET) 294a and a second transistor (e.g., an nMOSFET) 294b where the first and the second transistors 294a and 294b are configured substantially similarly to first and second transistors 290a and 290b as described immediately above. The fourth capacitive element 270d may similarly include a first transistor (e.g., a pMOSFET) 296a and a second transistor (e.g., an nMOSFET) 296b where the first and the second transistors 296a and 296b are configured substantially similarly to first and second transistors 290a and 290b as described immediately above.

Figure 3B:
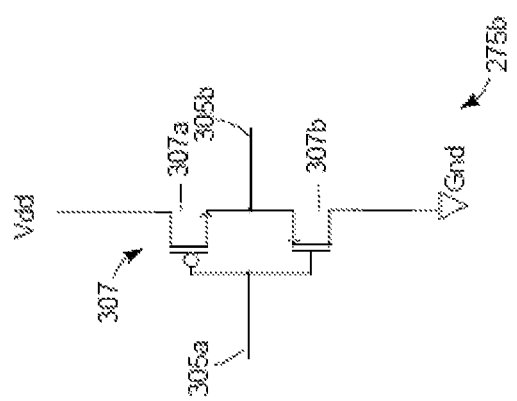
Figure 3A:
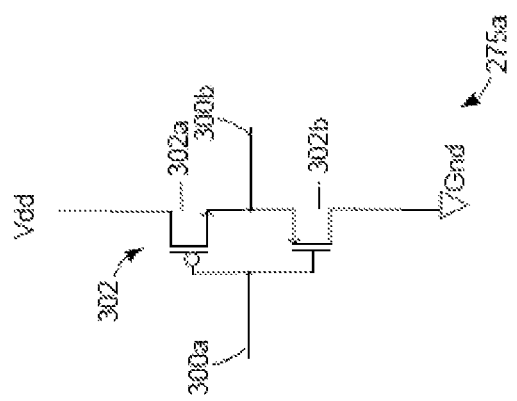

The first, second, third, and fourth resistive elements may be a variety of types of resistor types. According to one specific embodiment, first resistive element 275a includes an input node 300a and an output node 300b. FIG. 3A is a further detailed view of first resistive element 275a according to one embodiment. First resistive element may include a set of transistors 302. The set of transistors 302 may include a pull-up transistor (e.g., a pMOSFET transistor) 302a and a pull down transistor (e.g., an nMOSFET transistor) 302b in series with the pull-up transistor. The gates of the pull-up transistor and the pull-down transistor may be coupled and may be the input node 300a. Output node 300b may be between source-drain regions of the pull-up transistor and the pull-down transistor.

The second resistive element 275b may include an input node 305a and an output node 305b. FIG. 3B is a further detailed view of second resistive element 275b according to one embodiment. Second resistive element 275b may include a set of transistors 307. The set of transistors 307 may include a pull-up transistor (e.g., a pMOSFET transistor) 307a and a pull down transistor (e.g., an nMOSFET transistor) 307b in series with pull-up transistor 307a. The gates of pull-up transistor 307a and pull-down transistor 307b may be coupled and may be the input node 305a. Output node 305b may be between source-drain regions of pull-up transistor 307a and pull-down transistor 307b.

The third resistive element 285a may include an input node 310a and an output node 310b. FIG. 3C is a further detailed view of third resistive element 285a according to one embodiment of the present invention. Third resistive element 285a may include a set of transistors 312. The set of transistors 312 may include a pull-up transistor (e.g., a pMOSFET transistor) 312a and a pull down transistor (e.g., an nMOSFET transistor) 312b in series with the pull-up transistor. The gates of pull-up transistor 312a and the down transistor 312b may be coupled and may be the input node 310a. Output node 310b may be between source-drain regions of pull-up transistor 312a and pull-down transistor 312b.

The fourth resistive element 285b includes an input node 315a and an output node 315b. FIG. 3D is a further detailed view of the fourth resistive element 285b according to one embodiment of the present invention. The fourth resistive element 285b may include a set of transistors 317. The set of transistors 317 may include a pull-up transistor (e.g., a pMOSFET transistor) 317a and a pull down transistor (e.g., an nMOSFET transistor) 317b in series with the pull-up transistor. The gates of pull-up transistor 317a and the pull-down transistor 317b may be coupled and may be the input node 315a. Output node 315b may be between source-drain regions of pull-up transistor 317a and pull-down transistor 317b.

The first node-protection circuit 250 further includes a first set of pass transistors 320 and a second set of pass transistors 325 (or more generally a first pass circuit and a second pass circuit, respectively). The second node-protection circuit 255 further includes a third set of pass transistors 330, and a fourth set of pass transistors 335. The first set of pass transistors 320 includes a first pass transistor 320a and a second pass transistor 320b in parallel each with a first source-drain coupled to output node 300b and each with a second source-drain region couple to the second node 260b of master latch 205. First capacitive element 270a (e.g., the gates of transistors 290a and 290b) is also couple to output node 300b. A gate of the first pass transistor 320a is coupled to the clock network and more specifically is configured to receive clock signals transmitted from delay circuit 240c. A gate of the second pass transistor 320b is coupled to the clock network and more specifically is configured to receive clock signals transmitted from delay circuit 240d.

The second set of pass transistors 325 includes a first pass transistor 325a and a second pass transistor 325b in parallel each with a first source-drain coupled to output node 305b and each with a second source-drain region couple to the first node 260a of master latch 205. Second capacitive element 270b (e.g., the gates of transistors 292a and 292b) is also couple to output node 305b. A gate of the first pass transistor 325a is coupled to the clock network and more specifically is configured to receive clock signals transmitted from delay circuit 240c. A gate of the second pass transistor 325b is coupled to the clock network and more specifically is configured to receive clock signals transmitted from delay circuit 240*d*.

The third set of pass transistors 330 includes a first pass transistor 330*a* and a second pass transistor 330*b* in parallel each with a first source-drain coupled to output node 310*b* and each with a second source-drain region couple to the fourth node 260*b* of slave latch 210. Third capacitive element 280*a* (e.g., the gates of transistors 294*a* and 294*b*) is also couple to output node 310*b*. A gate of the first pass transistor 330*a* is coupled to the clock network and more specifically is configured to receive clock signals transmitted from delay circuit 240*b*. A gate of the second pass transistor 330*b* is coupled to the clock network and more specifically is configured to receive clock signals transmitted from delay circuit 240*a*.

The fourth set of pass transistors 335 includes a first pass transistor 335*a* and a second pass transistor 335*b* in parallel each with a first source-drain coupled to output node 315*b* and each with a second source-drain region couple to the first node 260*c* of slave latch 210. Fourth capacitive element 280*b* (e.g., the gates of transistors 296*a* and 296*b*) is also couple to output node 315*b*. A gate of the first pass transistor 335*a* is coupled to the clock network and more specifically is configured to receive clock signals transmitted from delay circuit 240*a*. A gate of the second pass transistor 335*b* is coupled to the clock network and more specifically is configured to receive clock signals transmitted from delay circuit 240*b*.

According to one embodiment, input node 300*a* of resistive element 275*a* is coupled to first node 260*a*, and output node 300*b* of resistive element 275*a* is coupled to input node 305*a* of resistive element 275*b*. According to another embodiment, input node 310*a* of resistive element 285*a* is coupled to third node 260*c*, and output node 310*b* of resistive element 285*a* is coupled to input node 315*a* of resistive element 285*b*.

First resistive element 275*a* is configured to receive the state data of the master latch at first node 260*a* and pull second node 260*b* up or down to reinforce the state data at the second node based on the state data of first node 260*a*. For example, if the state data at first node 260*b* is low, first resistive element 275*a* will pull high to reinforce an inverted state data (state data high) at second node 260*b*, and if the state data at first node 260*b* is high, the first resistive element will pull low to reinforce an inverted state data (state data low) at second node 260*c*. First resistive element 275*a* is configured to act as a redundant latch for the second node 260*b*. The first capacitive element 270*a* is configured to absorb generated charge. That is, first resistive element 275*a* and first capacitive element 270*a* are configured to reinforce the state data of the second node as described above if first pass transistor 320*a* or second pass transistor 320*b* receive a clock pulse from delay circuit 240*c* or 240*d*, respectively. According to one embodiment, first pass transistor 320*a* and second pass transistor 320*b* are configured to be clocked by the clock network after second input stage 220 is clocked to transfer state data to master latch 205. Specifically, the second input stage 220 is configured to receive a clock pulse from delay circuit 240*a*. The clock pulse from delay circuit 240*a* is delivered to the second input stage before the clock pulse from delay circuit 240*c* is delivered to the first pass transistor 320*a* and before the clock pulse from delay circuit 240*d* is delivered to the second pass transistor 320*b*. By clocking first pass transistor 320*a* and second pass transistor 320*b* after clocking the second input stage, first resistive element 275*a* and first capacitive element 270*a* are configured not to interfere with state data during the transfer of the state data from the second input stage to the master latch.

According to a further embodiment, second resistive element 275*b* is configured to receive state data from first node 260*a* via the first resistive element 275*a*. Second resistive element 275*b* is configured to pull first node 260*a* up or down to reinforce the state data at the first node based on the state data of the first node. The first and second resistive elements 275*a* and 275*b* may each be configured to invert received state data. Therefore, because second resistive element 275*b* is configured to receive state data from the first node via the first resistive element, which inverts the state data once, the second resistive element, which also inverts the state data once, provides the same non-inverted state data back to the first node. Second resistive element 275*b* is configured to act as a redundant latch for the first node 260*a*. The second capacitive element 270*b* is configured to absorb generated charge. Second resistive element 275*b* and second capacitive element 270*b* are configured to reinforce the state data of the first node as described above if first pass transistor 325*a* or second pass transistor 325*b* receive a clock pulse from delay circuit 240*c* or 240*d*, respectively. According to one embodiment, first pass transistor 325*a* and second pass transistor 325*b* are configured to be clocked by the clock network after second input stage 220 is clocked to transfer state data to master latch 205. Specifically, the second input stage 220 and master latch 205 are configured to receive a clock pulse from delay circuit 240*a*. The clock pulse from delay circuit 240*a* is delivered to the second input stage and the master latch before the clock pulse from delay circuit 240*c* is delivered to the first pass transistor 320*a* and before the clock pulse from delay circuit 240*d* is delivered to the second pass transistor 320*b*. As described above with respect to clocking the first resistive element 275*a*, by clocking first pass transistor 325*a* and second pass transistor 325*b* after clocking the second input stage and the master latch, second resistive element 275*a* and second capacitive element 270*a* are configured not to interfere with state data during the transfer of the state data from the second input stage to the master latch.

According to a further embodiment, the third resistive element 285*a* and the third capacitive element 280*a* are configured similarly to the first resistive element 275*a* and the first capacitive element 270*a* but differ in the clocking method were the third set of pass transistors 330 receives the same clock signal (i.e., without delay) as third input stage 225 and slave latch 210. The third resistive element 285*a* is configured as a redundant latch and is configured to reinforce state data at the fourth node 260*d* of slave latch 210. The third capacitive element is configured to absorb generated charge. That is, if the fourth node experiences a radiation strike, the third resistive element 285*a* and the third capacitive element 280*a* are configured to inhibit the state data at the fourth node 260*d* of slave latch 210 from changing. Specifically, third resistive element 285*a* is configured to receive the state data from the slave latch at third node 260*c* and pull fourth node 260*d* up or down to reinforce the state data at the fourth node based on the state data of third node 260*c*. For example, if the state data at third node 260*c* is low, third resistive element 285*a* will pull high to reinforce an inverted state data (state data high) at fourth node 260*d*, and if the state data at third node 260*c* is high, the first resistive element will pull low to reinforce an inverted state data (state data low) at fourth node 260*d*. Third resistive element 285*a* and third capacitive element 280*a* are configured to reinforce the state data of the fourth node as described above if first pass transistor 330*a* or second pass transistor 330*b* receives a clock pulse from one or more of the delay circuits.

According to a further embodiment, the fourth resistive element 285*b* and the fourth capacitive element 280*b* are configured similarly to the second resistive element 275b and the second capacitive element 270b but differ in the clocking method were the fourth set of pass transistors 335 receives the same clock signal (i.e., without delay) as third input stage 225 and slave latch 210. The fourth resistive element 285b is configured as a redundant latch and is configured to reinforce state data at the third node 260c of slave latch 210. The fourth capacitive element 280b is configured to absorb generated charge. That is, if the third node experiences a radiation strike, the fourth resistive element 285b and the fourth capacitive element 280b are configured to inhibit the state data at the third node 260c of slave latch 210 from changing. Specifically, fourth resistive element 285b is configured to receive state data from third node 260c via the third resistive element 285a. Fourth resistive element 285b is configured to pull third node 260c up or down to reinforce the state data at the third node based on the state data of the third node. The third and fourth resistive elements 285a and 285b may each be configured to invert received state data. Therefore, because third resistive element 285b is configured to receive state data from the third node via the third resistive element, which inverts the state data once, the fourth resistive element, which also inverts the state data once, provides the same non-inverted state data back to the third node. Fourth resistive element 285b and fourth capacitive element 280b are configured to reinforce the state data of the third node as described above if first pass transistor 335a or second pass transistor 335b receive a clock pulse from the clock network.

Figure 4:
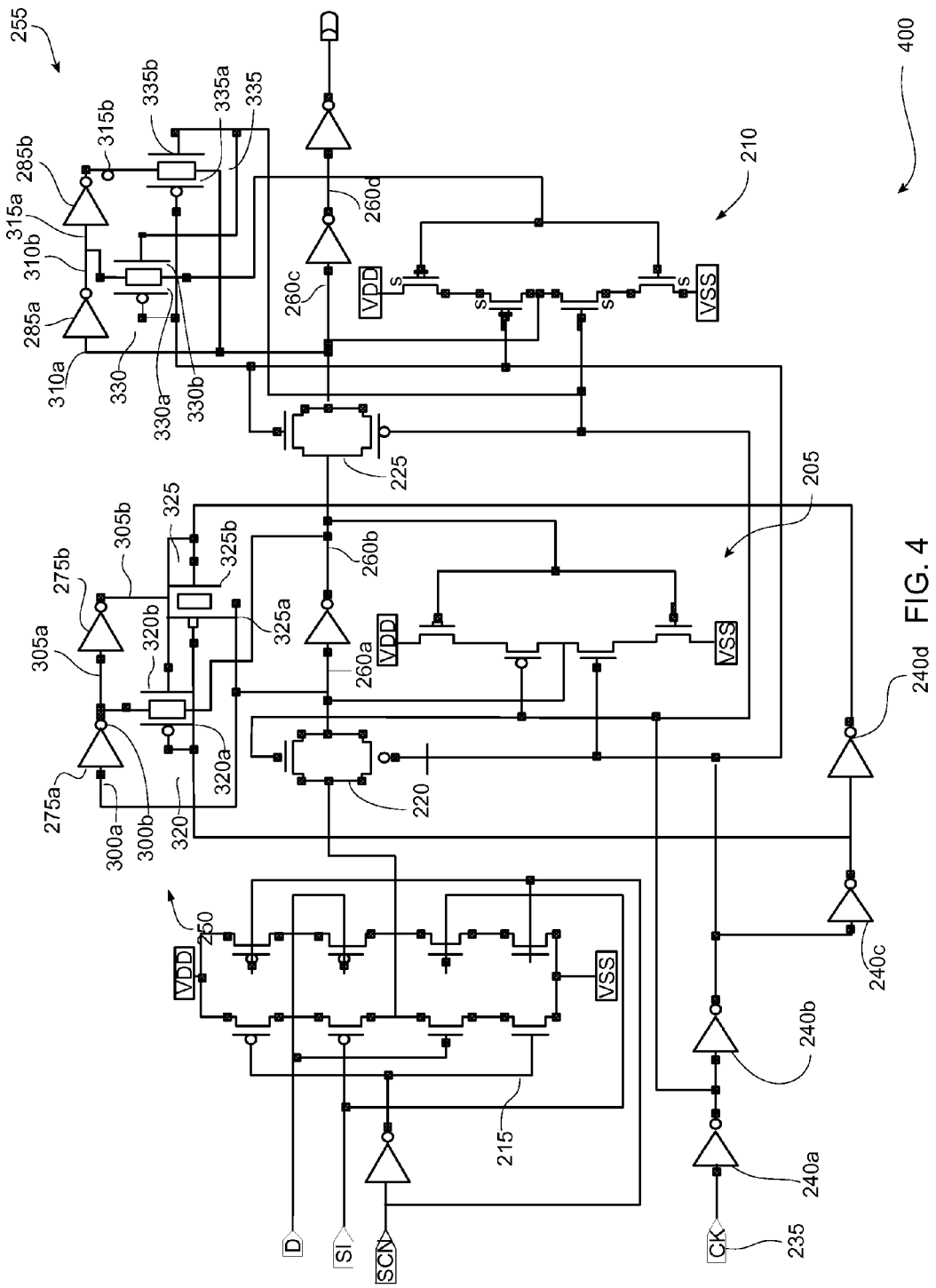
FIG. 4 is a simplified schematic of a latch circuit according to another embodiment of the present invention.

According to various further embodiments, first node-protection circuit 250 may provide resistive reinforcement for the first node 260a and the second node 260b as described above, but may not provide capacitive reinforcement for the first node 260a and the second node 260b. Similarly, second node-protection circuit 255 may provide resistive reinforcement for the third node 260c and the fourth node 260d as described above, but may not provide capacitive reinforcement for the third node 260c and the fourth node 260d. FIG. 4 is a simplified schematic of a latch circuit 400 that is substantially similar to latch circuit 200 but differs in that latch circuit 400 does not include the first, second, third, and fourth capacitive elements 270a, 270b, 280a, and 280b and does not provide capacitive reinforcement for the first, second, third, and fourth nodes as described above.

According to various further embodiments, first node-protection circuit 250 may provide capacitive reinforcement for the first node 260a and the second node 260b as described above, but may not provide resistive reinforcement for the first node 260a and the second node 260b. Such a circuit might not include first and second resistive elements 275a and 275b. Similarly, second node-protection circuit 255 may provide capacitive reinforcement for the third node 260c and the fourth node 260d as described above, but may not provide resistive reinforcement for the third node 260c and the fourth node 260d. Such a circuit might not include third and fourth resistive elements 285a and 285b.

According to various further embodiments, first node-protection circuit 250 may provide resistive reinforcement and/or capacitive reinforcement of first node 260a as described above, but not may not provide resistive reinforcement and capacitive reinforcement of second node 260b. According to various further embodiments, second node-protection circuit 255 may provide resistive reinforcement and/or capacitive reinforcement of third node 260c as described above, but not may not provide resistive reinforcement and capacitive reinforcement of fourth node 260d.

Figure 5:
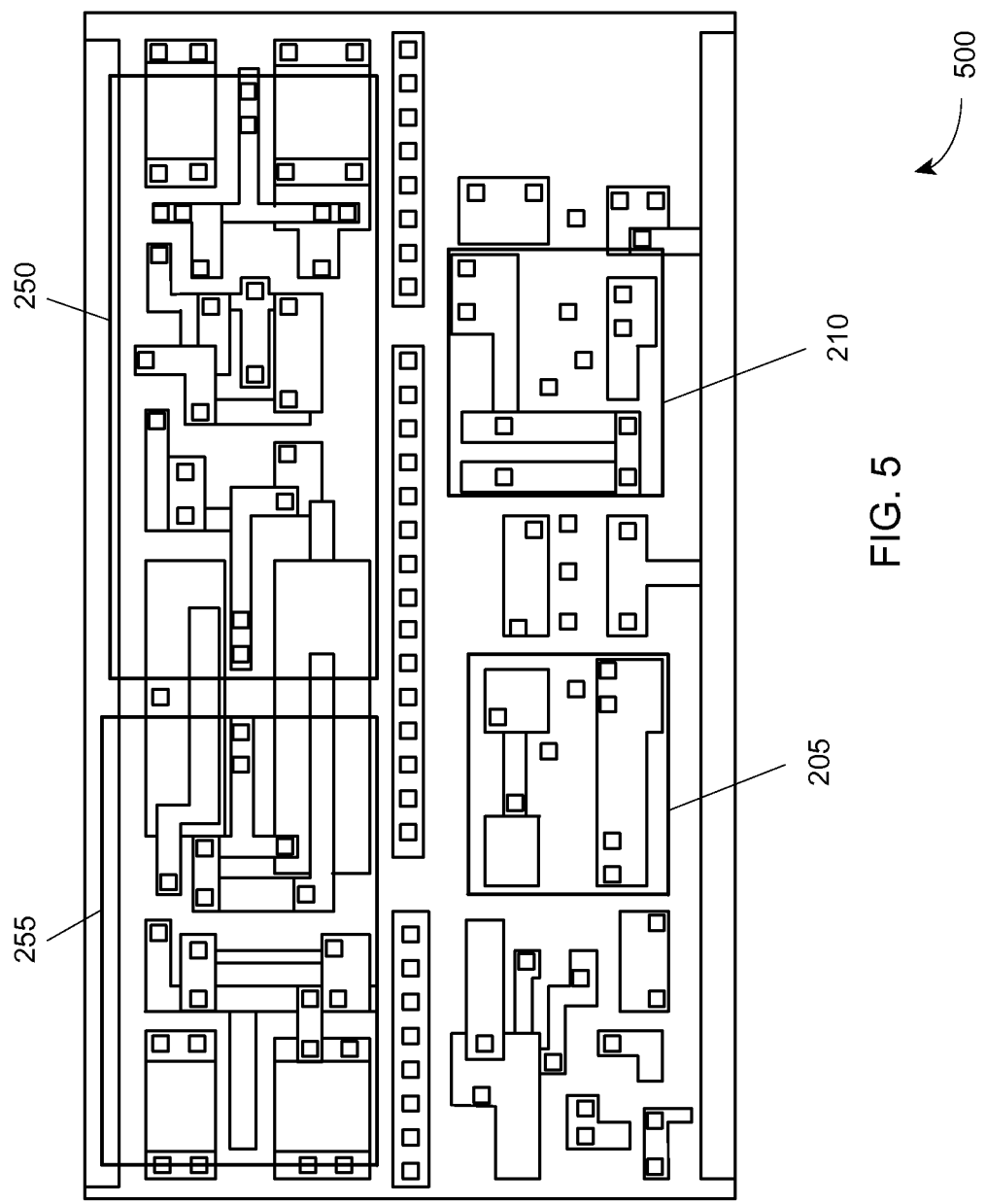
FIG. 5 is a simplified schematic of a layout of the latch circuit of FIG. 2 or FIG. 4 according to one embodiment of the present invention.

FIG. 5 is a simplified schematic of a layout 500 of latch circuit 200 or latch circuit 400 according to various embodiments of the present invention. According to one embodiment, the master latch 205 and the first node-protection circuit 250 are disposed on a diagonal to provide a relatively large distance between the master latch and the first node-protection circuit. Also, the slave latch 210 and the second node-protection circuit 255 are disposed on a diagonal to provide a relatively large distance between the slave latch and the second node-protection circuit. Providing a relatively large distance between the master latch and the first node-protection circuit provides that a single radiation strike will have a relatively low likelihood of striking both the master latch and the first node-protection circuit substantially simultaneously to corrupt the state data in both the master latch and the first node-protection circuit, thereby adding addition protection to the state data stored in the master latch and stored redundantly in the first node-protection circuit. Corrupting state data via a radiation strike in the master latch and the first node-protection circuit substantially simultaneously increases the likelihood in general that the radiation strike will cause the state data stored in the master latch and the first node-protection circuit to be lost. Similarly, providing a relatively large distance between the slave latch and the second node-protection circuit provides that a single radiation strike will have a relatively low likelihood of striking both the slave latch and the second node-protection circuit substantially simultaneously to corrupt the state data in both the slave latch and the second node protection circuit, thereby adding addition protection to the state data stored in the slave latch and stored redundantly in the second node-protection circuit.

According to one embodiment, the latch circuits embodiments described herein may be laid out as a tri-level circuit. A tri-level circuit is a circuit in which transistors in the circuit are stacked in three vertical layers, with a bottom layer of transistors, a middle layer of transistor over the bottom layer, and a top layer of transistors over the bottom layer, but not in contact with the bottom layer of transistors. The bottom layer and the top layer of a tri-level circuit do not share the same ground wells, e.g., n-wells. The middle layer of a tri-level circuit may share ground wells (e.g., n-wells) with the bottom layer or the third layer. The master latch and the first node-protection circuit may be disposed in the bottom layer and the top layer, respectively. Alternatively, the master latch and the first node-protection circuit may be disposed in the top layer and the bottom layer, respectively. Providing that the master latch and the first node-protection circuit are so disposed provides a further reduced likelihood that a single radiation strike will substantially simultaneously strike both the master latch and the first node-protection circuit thereby providing a further reduced likelihood for corruption of the state data in the master latch and the first node protection circuit. That is, providing separated grounds (e.g., n-wells) limits the likelihood that a radiation strike in the power plane or ground will cause a loss of state data stored in the master latch and the first node-protection circuit.

The slave latch and the second node-protection circuit may similarly be disposed in the bottom layer and the top layer, respectively. Alternatively, the slave latch and the second node-protection circuit may be disposed in the top layer and the bottom layer, respectively. As similarly described above with respect to the master latch and the first node-protection circuit, providing that the slave latch and the second node-protection circuit are so disposed provides a further reduced likelihood that a single radiation strike will substantially simultaneously strike both the slave latch and the second node-protection circuit thereby providing a further reduced likelihood for corruption of the state data in the slave latch and the second node protection circuit.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, the protection-node circuits described herein may be coupled to a variety of nodes that may be susceptible to state data changes if the possibility exits that the nodes are subject to state data Based on the above disclosure and the following claims, other arrangements, embodiments, implementations and equivalents may be employed without departing from the scope of the invention as defined by the claims.

What is claimed is:

1. A circuit comprising:
    a latch having an input node and an output node;
    a resistive element configured to be coupled to the input node to resist a change of state data at the input node from a radiation strike;
    a capacitive element configured to be coupled to the input node to resist a change of the state data at the input node from the radiation strike, the capacitive element including a pair of transistors having coupled gates, a first source-drain region of the pair of transistors coupled to a voltage source and a second source-drain region of the pair of transistors coupled to a ground;
    an input stage coupled to the input node and configured to be clocked to transfer the state data to the latch; and
    a pass circuit configured to be clocked after the input stage to couple the resistive element and the capacitive element to the input node after the input stage transfers the state data to the latch.

2. The circuit of claim 1, wherein the coupled gates are coupled to the pass circuit to provide capacitance to the input node to collect charges generated by a radiation strike at the input node.

3. The circuit of claim 1, wherein the latch and the resistive element are disposed diagonally in a circuit layout of the circuit and the latch and the capacitive element are disposed diagonally in the circuit layout.

4. The circuit of claim 3, wherein the circuit layout is for a tri-level circuit, the latch is on a first circuit level of the tri-level circuit, and the resistive element and the capacitive elements are on a third circuit level of the tri-level circuit.

5. The circuit of claim 4, wherein the first circuit level includes a first n-well and the third circuit level includes a second n-well that is different from the first n-well.

6. The circuit of claim 1, wherein the state data is first state data, the pass circuit is a first pass circuit, the resistive element is a first resistive element, and further comprising:
    a second resistive element configured to be coupled to the output node to resist a change of second state data at the output node from the radiation strike; and
    a second pass circuit configured to be clocked after the input stage to couple the second resistive element to the output node after the input stage transfers the first state data to the latch.

7. The circuit of claim 6, wherein:
    the second resistive element includes a first pull-up transistor and a first pull-down transistor in series, and gates of the first pull-up transistor and the first pull-down transistor are coupled to the input node and configured to receive the first state data at the input node; and
    the first pull-up transistor is configured to pull up the output node if the first state data at the input node is low, and the first pull-down transistor is configured to pull down the output node if the first state data at the input node is high.

8. The circuit of claim 7, wherein:
    the first resistive element includes a second pull-up transistor and a second pull-down transistor in series, and gates of the second pull-up transistor and the second pull-down transistor are coupled to the second resistive element to receive the first state data from the input node via the second resistive element; and
    the second pull-up transistor is configured to pull up the input node if the first state data at the input node is high, and the second pull-down transistor is configured to pull down the input node if the first state data at the input node is low.

9. The circuit of claim 6, wherein the capacitive element is a first capacitive element, further comprising a second capacitive element configured to be coupled to the output node to resist a change of the second state data at the output node from the radiation strike, and the second pass circuit is further configured to be clocked after the input stage to couple the second capacitive element to the output node.

10. The circuit of claim 9, wherein the second capacitive element includes a pair of transistors having coupled gates, a first source-drain region coupled to a voltage source, and a second source-drain region coupled to the ground.

11. The circuit of claim 10, wherein the coupled gates of the second capacitive element are coupled to the second pass circuit to provide capacitance to the output node effective to collect charges generated by the radiation strike at the output node.

12. The circuit of claim 1, wherein the input node and the output node are latch nodes of a latch configured to latch the state data and an inversion of the state data respectively.

13. The circuit of claim 1, further comprising a clock network coupled to the input stage and the pass circuit, the clock network configured to clock the input stage before the pass circuit.

14. The circuit of claim 1, wherein the latch is a master latch.

15. The circuit of claim 1, wherein the latch is a slave latch.

16. A circuit comprising:
    a latch having an input node and an output node;
    a first resistive element configured to be coupled to the input node to resist a change of first state data at the input node from a radiation strike;
    an input stage coupled to the input node and configured to be clocked to transfer the first state data to the latch;
    a first pass circuit configured to be clocked after the input stage to couple the first resistive element to the input node after the input stage transfers the first state data to the latch;
    a second resistive element and a capacitive element, each of which is configured to be coupled to the output node to resist a change of second state data at the output node from the radiation strike, the capacitive element including a pair of transistors having coupled gates, a first source-drain region coupled to a voltage source, and a second source-drain region coupled to a ground; and
    a second pass circuit configured to be clocked after the input stage to couple the second resistive element and the capacitive element to the output node after the input stage transfers the first state data to the latch.

17. The circuit of claim 16, wherein the capacitive element is a first capacitive element, further comprising a second capacitive element configured to be coupled to the input node to resist a change of the state data at the input node from the radiation strike, and the second pass circuit is further configured to be clocked after the input stage to couple the second capacitive element to the input node.

18. The circuit of claim 16, wherein the input node and the output node are latch nodes of the latch, the latch configured to latch the first state data and an inversion of the first state data respectively.

19. The circuit of claim 16, further comprising a clock network coupled to the input stage and the first pass circuit, the clock network configured to clock the input stage before the first pass circuit.

20. The circuit of claim 16, wherein the latch and the first resistive element are disposed diagonally in a circuit layout of the circuit and the latch and the first capacitive element are disposed diagonally in the circuit layout.

21. The circuit of claim 20, wherein the circuit layout is for a tri-level circuit, the latch is on a first circuit level of the tri-level circuit, and the second resistive element and the first capacitive element are on a third circuit level of the tri-level circuit.

22. The circuit of claim 21, wherein the first circuit level includes a first n-well and the third circuit level includes a second n-well that is different than the first n-well.

23. The circuit of claim 16, wherein in the latch is a master latch or a slave latch of a redundant latch circuit.

* * * * *